United States Patent [19]

Scalo et al.

[11] Patent Number: 5,706,322
[45] Date of Patent: Jan. 6, 1998

[54] PRECISION TIME OF DAY COUNTER

[75] Inventors: Albert D. Scalo; Bruce F. Karaffa, both of State College, Pa.

[73] Assignee: E-Systems, Inc., Dallas, Tex.

[21] Appl. No.: 439,186

[22] Filed: May 11, 1995

[51] Int. Cl.⁶ ............................................. H03K 21/40
[52] U.S. Cl. ........................ 377/20; 377/51; 377/54; 377/78
[58] Field of Search ........................ 377/20, 51, 54, 377/78

[56] References Cited

U.S. PATENT DOCUMENTS

| | | | |
|---|---|---|---|
| 3,371,282 | 2/1968 | Wege | 328/43 |
| 3,654,440 | 4/1972 | Hanchett | 235/92 PE |
| 3,849,635 | 11/1974 | Freedman | 235/92 CC |
| 4,203,030 | 5/1980 | Moran | 235/92 CC |
| 4,249,070 | 2/1981 | Miller | 235/92 T |
| 4,285,483 | 8/1981 | Cipollone | 246/107 |
| 4,447,918 | 5/1984 | Nossen et al. | 377/37 |
| 4,503,525 | 3/1985 | Malik et al. | 365/222 |
| 4,780,894 | 10/1988 | Watkins et al. | 377/51 |
| 4,914,616 | 4/1990 | Shiraishi et al. | 364/770 |
| 4,982,414 | 1/1991 | Kitoro | 377/51 |
| 5,038,355 | 8/1991 | Chabanne et al. | 377/44 |
| 5,062,126 | 10/1991 | Radys | 377/51 |
| 5,224,133 | 6/1993 | Vanstraelen | 377/51 |

Primary Examiner—Margaret Rose Wambach
Attorney, Agent, or Firm—Harold E. Meier

[57] ABSTRACT

A very high speed counter system of operating at frequencies of up to around 800 MHz provides timing measurements with accuracies on the order of (1/f) seconds where f is the frequency of operation. The least significant bit of the counter operates at the given frequency of a first clock signal while the other higher order bits operate at a second clock signal where the second clock signal is one-half the frequency of the first clock signal and is inverted. Carry lookahead circuits connected between stages of the second counter operate in conjunction with the clocking scheme to produce a high speed and accurate counter.

34 Claims, 5 Drawing Sheets

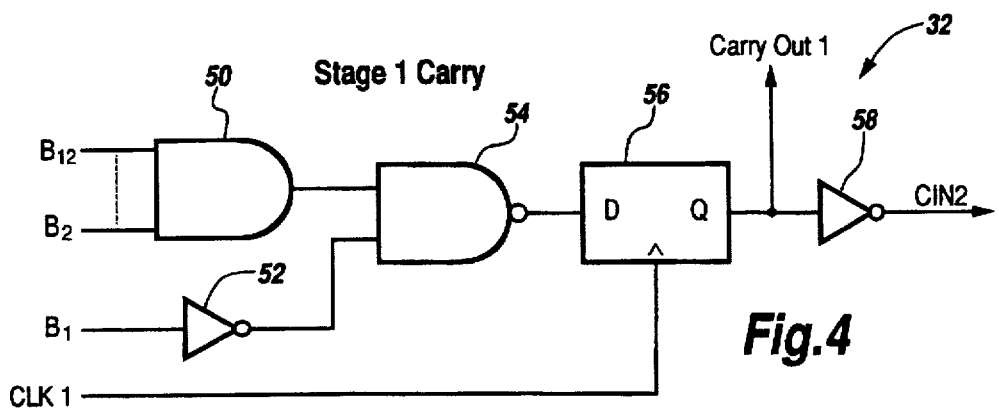
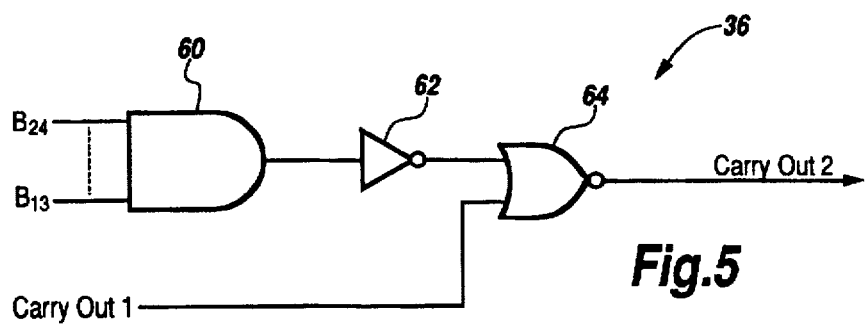
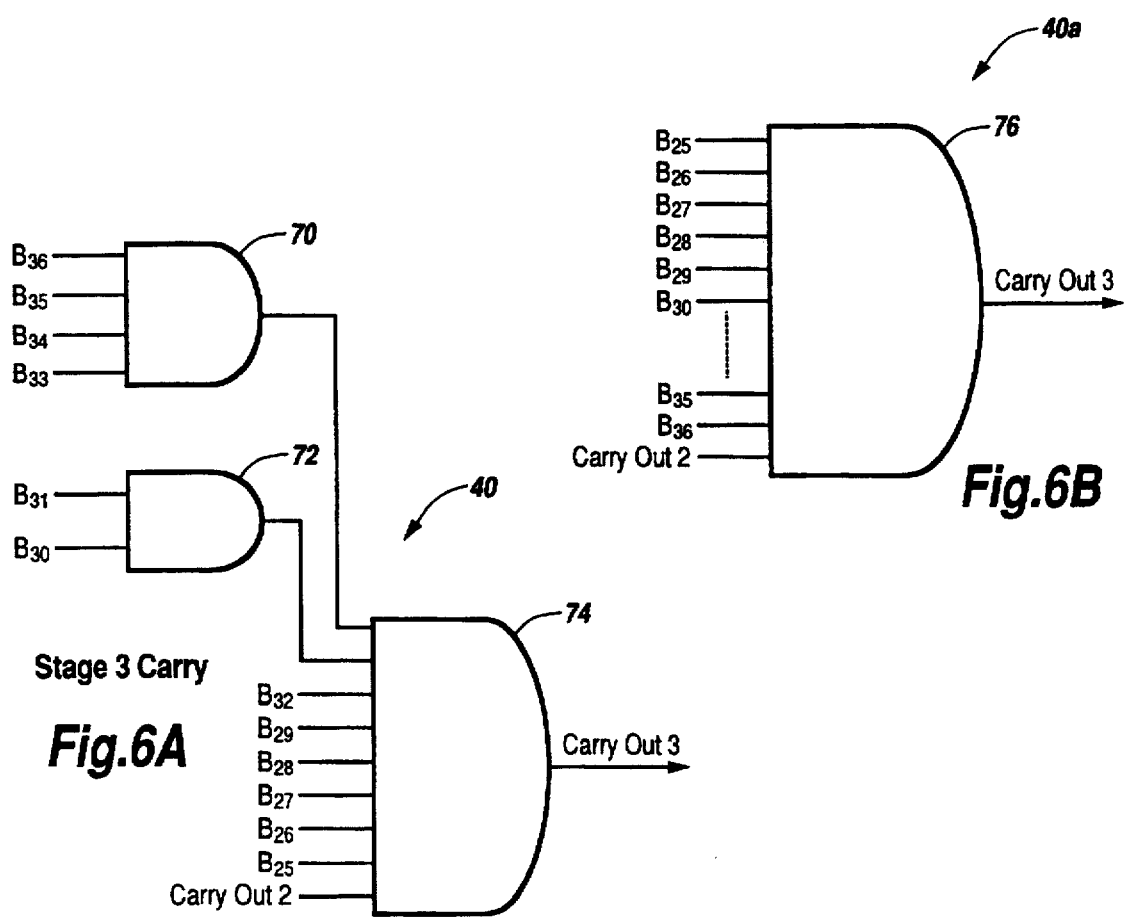

PRECISION TIME OF DAY COUNTER

TECHNICAL FIELD OF THE INVENTION

The present invention relates to high speed synchronous counters, and more particularly, to a high speed synchronous counter operating at high frequencies wherein one portion of the counter utilizes a first clock signal and another portion of the counter utilizes a second clock signal, derived from the first clock signal.

BACKGROUND OF THE INVENTION

Many different types and designs of binary counters have been implemented throughout the years. The structure and operation of previously implemented counters produce inherent propagation delays in carry signals. Such propagation delays limit the speed at which a counter can operate, thus reducing the accuracy of the counter. Partial reduction of these propagation delays resulting in an increase of the count rate have accurately been accomplished through use of specialized lookahead carry circuitry employing one, two and even three clock pulse lookahead schemes, while others have used these lookahead schemes in conjunction with edge-triggered circuitry.

Ripple counters and synchronous counters are the most common type of counters in existence today. Counters containing a substantially large number of bits (long counters) are generally made up of a string of identical smaller counters (often called stages). These smaller counters are connected by carry signals. A carry signal indicates that the counter (or a particular stage of the counter) has reached its maximum count and will rollover to all zeros, therefore the next counter in the chain should increment.

The problem with present "long counters" comprising a large number of bits and utilizing lookahead carry schemes is that the propagation delays of the carry signals from stage to stage are still relatively substantial when operating at a very high frequency. Since the speed at which a long counter can operate is usually limited by the propagation delay of the carry signals to the last stage, even a propagation delay on the order of one gate delay is substantial at high frequencies. This reduces the maximum operating frequency of the counter.

Accordingly, there is a need for a precision high speed counter comprised of numerous smaller counters whereby the propagation delay of the carry signals is minimized thereby allowing the counter to operate at a given clock frequency "f" with an accuracy approaching 1/f seconds. Further, there is a need for a precision time of day counter for accurately counting and latching the counted value upon the occurrence of a timing event whereby the precision of the count value is 1/f seconds.

SUMMARY OF THE INVENTION

The counting system of the present invention comprises a counter including a first stage having at least one register defining a bit position and a plurality of successive stages each having at least one register defining a bit position; each register comprises a plurality of logic gates. The first stage operates using a first clock signal having periodic clock pulses while the successive stages operate using a second clock signal having periodic clock pulses derived from the first clock. The overall counter will run at frequency f even though successive stages run at frequency $f/(2^b)$ where b equals the number of bits in the first stage. A circuit generates lookahead carry signals that are supplied to at least one of the successive stages of the counter. Also included in the counter system is a circuit for supplying the first and second clock signals to the counter.

A second embodiment of the present invention includes a counting system having a first counter comprising one register defining the least significant bit of the counting system whereby the first counter utilizes a first clock signal. The counting system further includes a second counter comprising a plurality of successive stages each having at least one register, each of said registers defining a bit position of the counting system whereby the second counter utilizes a second clock signal that is one-half the frequency of the first clock signal. Also provided is a circuit for generating and supplying lookahead carry signals to at least one of the successive stages of the second counter.

Another embodiment of the present invention comprises a precision time of day counting system. The precision time of day counting system includes a main counter comprising a first counter utilizing a first clock signal and a second counter comprising a plurality of stage counters interconnected with a plurality of carry signals. Each stage counter has at least one register defining a bit. The second counter utilizes a second clock signal derived from the first clock signal. The counting system further includes a circuit for generating and supplying the carry signals to the stage counters. A timing channel receives a timing signal for latching the bit or value of the first counter and the bits or values of the second counter into a first latch register and second latch register respectively. The latched bits or counter value is then serially output through a shift register.

BRIEF DESCRIPTION OF THE DRAWINGS

FIG. 4 is a schematic diagram of the carry signal generation circuit of the first stage for generating the carry signal for stage two;

FIG. 5 is a schematic diagram of the carry signal generation circuit of the second stage for generating the carry signal for stage three;

FIG. 6A is a schematic diagram of the carry signal generation circuit of the third stage for generating the carry signal for stage four FIG. 6B is an alternative schematic diagram of the carry signal generation circuit shown in FIG. 6A.

DETAILED DESCRIPTION

Figure 1:
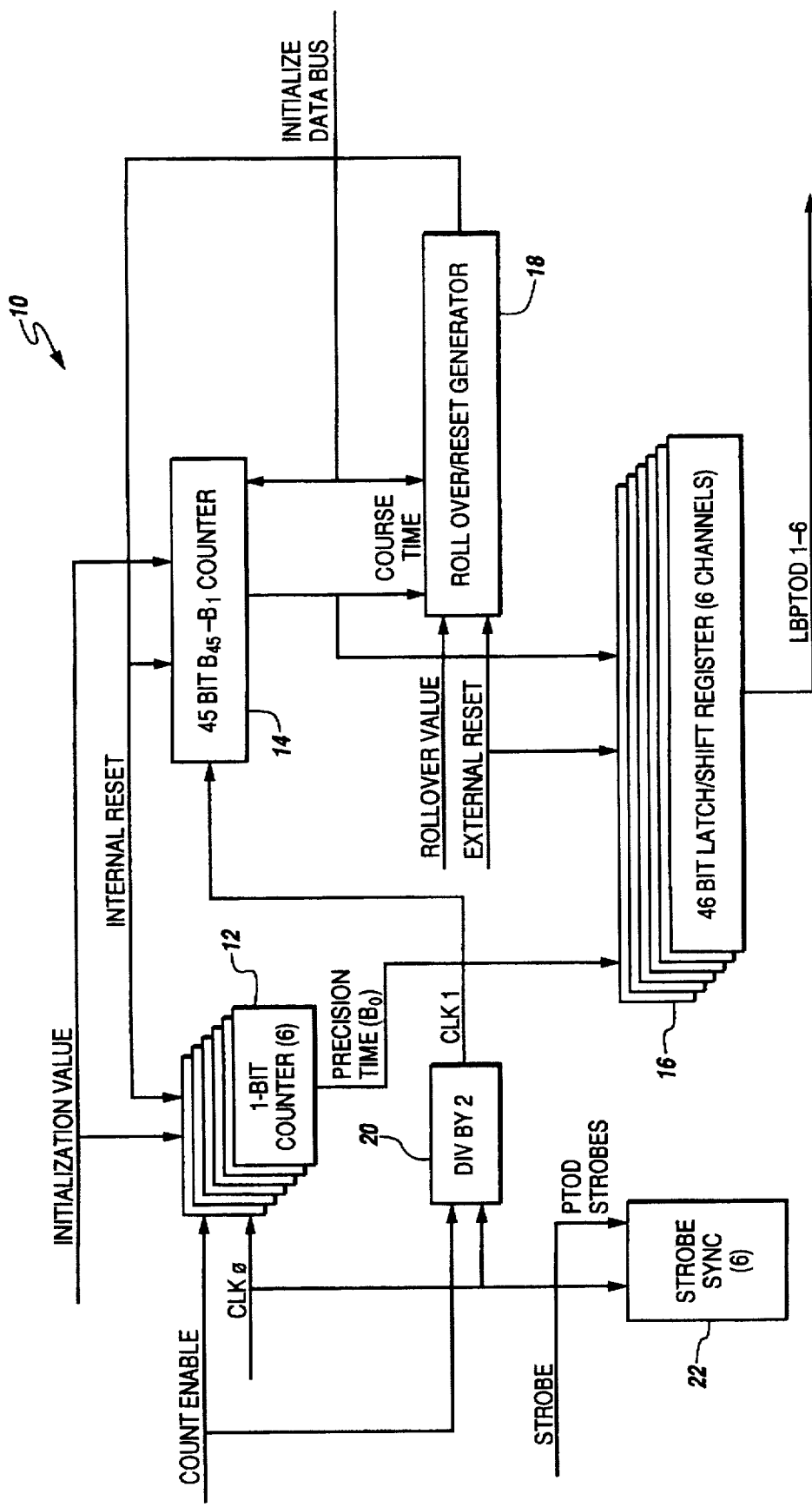
FIG. 1 is a functional block diagram of a precision time of day counter system.

Referring now to FIG. 1, there is shown a block diagram of the precision time of day counting system 10 of the present invention. The counting system 10 is shown comprising six major functional modules including a plurality of first counters 12, a second counter 14, a plurality of latch/shift registers 16, a rollover/reset generator 18, a clock signal generator 20, and a plurality of timing signal synchronization modules 22.

The counting system 10 typically receives a STROBE signal when an external event has occurred. The STROBE signal causes a counter value to be latched which can be subsequently output from the counting system 10. As shown in FIG. 1, the counting system 10 preferably comprises a plurality of STROBE signals. In the preferred embodiment, the counting system 10 includes 6 STROBE signals. As such, the counting system 10 has six timing channels for latching the counter value in response to one of the six STROBE signals. Further, the counting system 10 comprises six first counters 12, six timing signal synchronization modules 22 and six latch/shift registers 16, one for each of the timing channels.

Figure 2:
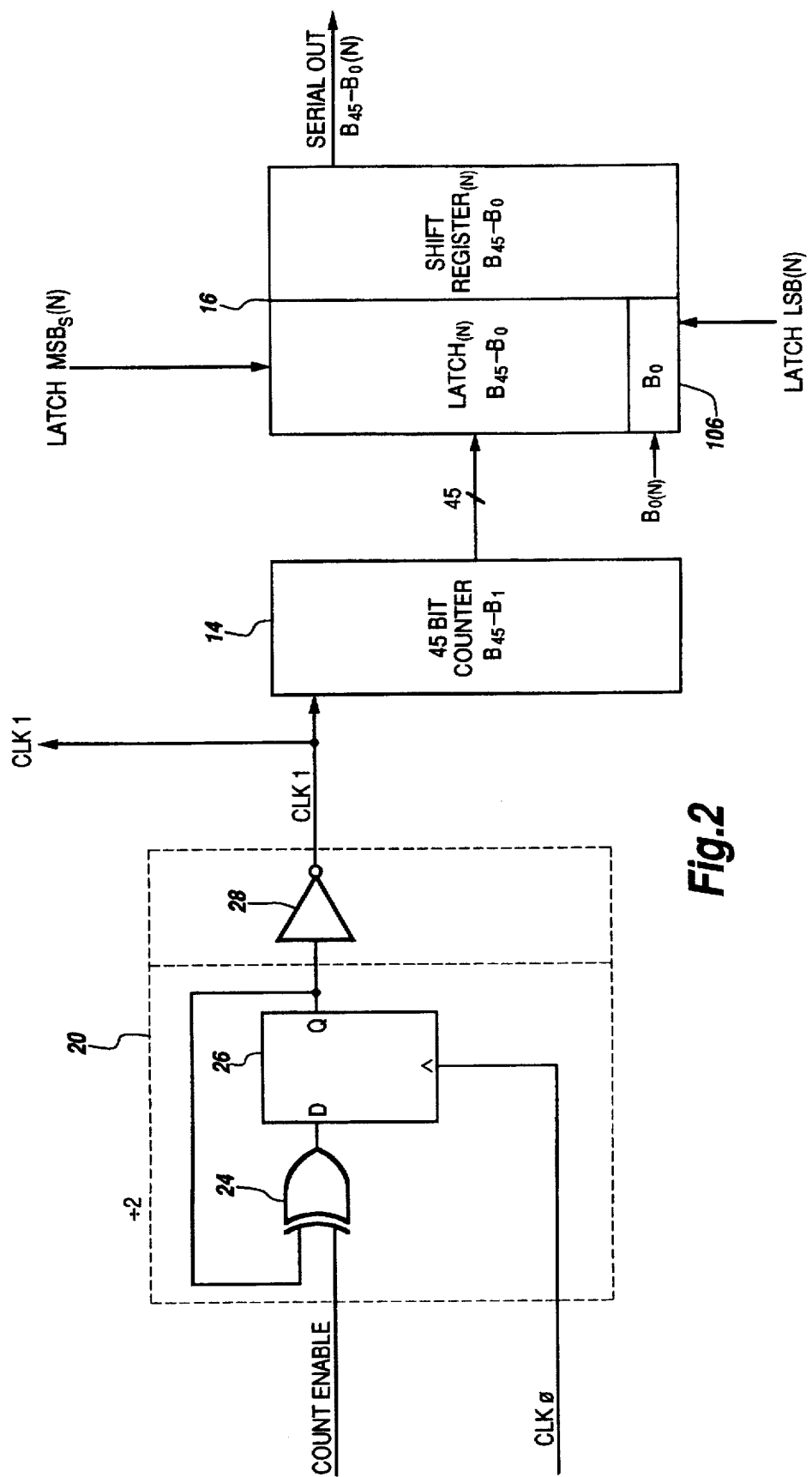
FIG. 2 is a schematic diagram of the divide by two circuit of FIG. 1 and a block diagram of the second counter and latch/shift registers of FIG. 1.

Referring now to FIG. 2, there is shown a schematic diagram of the clock signal generator 20 and a block diagram showing the second counter 14 and the latch/shift registers 16. The clock signal generator 20 is a divide-by-two circuit and includes an EXOR gate 24, a D-type flip-flop 26 and an inverter gate 28. The signal COUNT ENABLE is input to the EXOR gate 24 while the signal CLKφ is input to the clocking input of the D-type flip-flop 26. The output of the D-type flip-flop 26 is fed back to the EXOR gate 24 and also input to the inverter gate 28. The signal COUNT ENABLE is an active high enable signal and must be high to enable the counting system 10 to count.

The signal CLKφ is a clock signal having a predetermined frequency and is generated externally to the counting system 10. The signal CLKφ can range up to about 800 MHz. Operation of the counting system at about 800 MHz results in an accuracy of about 1.25 nanoseconds per count. The output signal CLK1 of the clock signal generator 20 has a frequency equal to one-half the frequency of the clock signal CLKφ and is inverted by the inverter gate 28. The signal CLK1 is the clock signal input for the second counter 14 while the signal CLKφ is the clock signal input for the first counter 12. As shown, the second counter 14 counts at a rate equal to the frequency of the signal CLK1, which is one-half the frequency of the clock signal CLKφ. As will be appreciated by a person skilled in the art, the clock signal generator 20 could also be a divide-by-four (or eight, sixteen, etc.) circuit. In such a case, the first counter 12 would then include two (or three or four, etc.) bit registers. Further, the clock signal CLK1 generated by the clock signal generator 20 could also be generated by inverting (180 degrees out of phase with) the most significant bit of the first counter 12, thus producing the clock signal CLK1 having a frequency equal to $1/(2^b)$ times the frequency of the clock signal CLKφ, where "b" equals the number of bits in the first counter 12. In the preferred embodiment, the first counter is a one bit counter.

Figure 3:
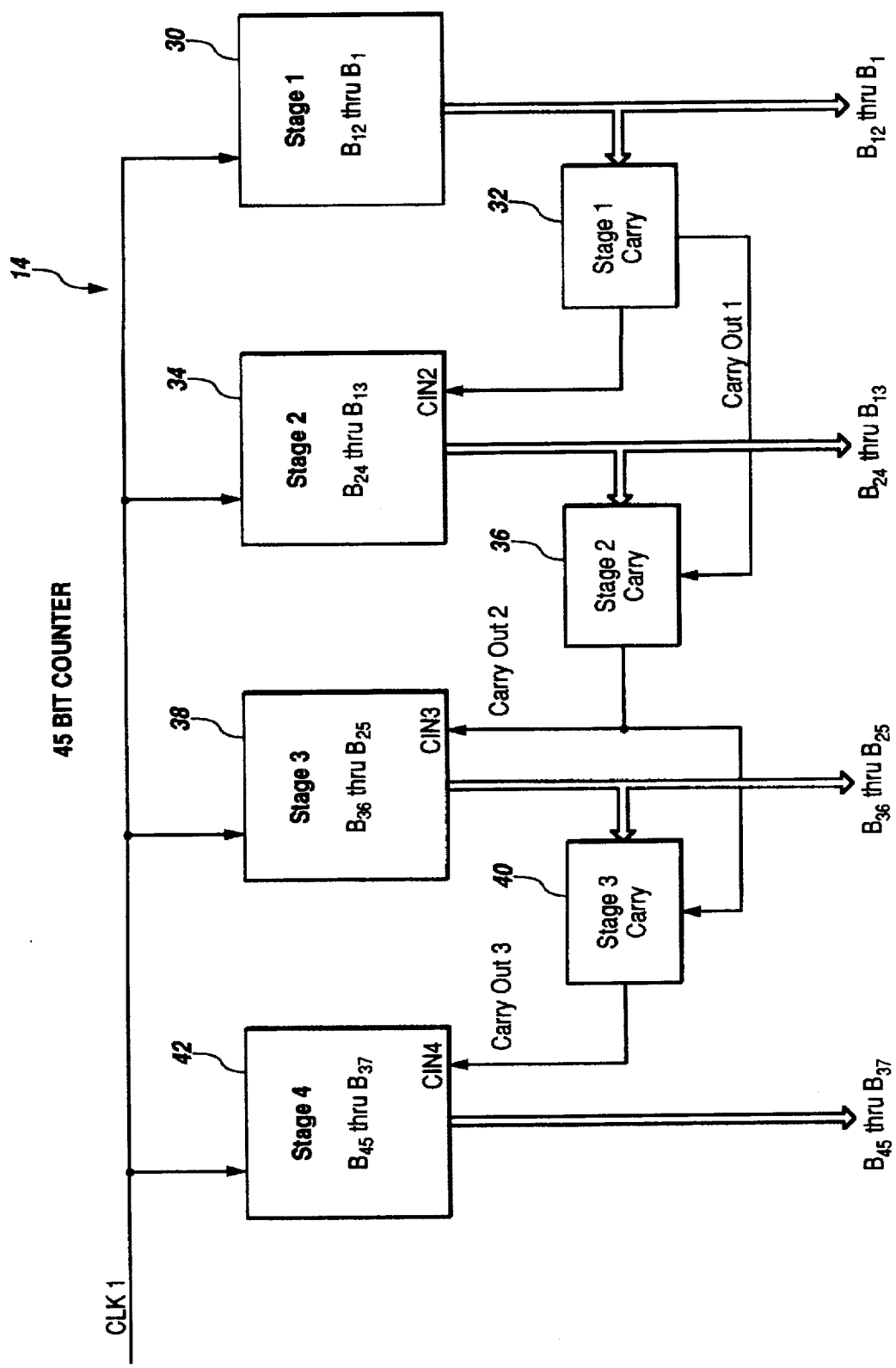
FIG. 3 is a block diagram illustrating the plurality of stages of the second counter of FIG. 1 and showing the carry signals between each stage.

Referring now to FIG. 3, there is shown the second counter 14 comprising a plurality of stages (or smaller counters). Each stage comprises a plurality of registers, each register defining a bit (or bit position) whereby each register comprises a plurality of logic gates. In the preferred embodiment, the second counter 14 is a forty-five bit counter defining bits (or bit positions) $B_{45}$ through $B_1$ and is divided into four stages (or counters). The first stage 30 is a twelve bit counter defining bits $B_{12}$ through $B_1$. The first stage 30 comprises a plurality of flip-flops where the basic equation for each flip-flop is:

$$D_n(t)=(Q_{n-1}*Q_{n-2}* \ldots *Q_0*CARRYIN) \text{ EXOR } Q_n$$

where $Q_n \ldots Q_0$ are the outputs of the flip-flops at (t-1). In the preferred embodiment, a twelve two-input OR-AND Complex Gate is used to limit the number of logic levels in this stage. As will be appreciated, there are many techniques and structures known to one skilled in the art for implementing these equations which may include gate array designs, standard cell designs, and/or application specific integrated circuit (ASIC) designs. The twelve input OR-AND gate functions as a twelve input AND by connecting each of the Q's to one input of an unique (to that Q) two input OR gate and connecting the other inputs of the OR gates to logic zero. With reference to the logic equation above, it will be apparent that the $Q_0$ and $Q_1$ outputs will be heavily loaded. Since the speed of a logic gate decreases with an increase in the number of loads tied to its output, extra flip-flops are added to balance the loading on the two least significant bits of the first stage 30. As such, the two least significant bit registers are duplicated in parallel format to reduce the loading and thus increase the speed of the first stage 30.

The second stage 34 and the third stage 38 are also twelve bit counters and are similar in structure to the first stage 30. The second stage 34 defines bits $B_{24}$ through $B_{13}$ while the third stage 38 defines bits $B_{36}$ through $B_{25}$. The fourth stage 42 is a nine bit counter defining bits $B_{45}$ through $B_{37}$.

The operating frequency of the second counter 14 depends on the propagation delays of the carry signals along the path between each of the stages. Since this is an important path in the 45-bit counter, each carry signal between stages is generated individually. The carry signal input to the second stage 34 is generated by a first stage carry circuit 32. Similarly, the carry signal of the third stage 38 is generated by a second stage carry circuit 36 while the carry signal input to the fourth stage 42 is generated by a third stage carry circuit 40. The stage carry circuits 32, 36, and 40 function in conjunction with the clocking scheme of the present invention to reduce the propagation delays in the counting system 10 to less than 1/f where "f" is the frequency of the clock signal CLK1.

As such, with the clock signal CLKφ having a frequency of 800 MHz, the accuracy of the counter value latched upon occurrence of an external event is about 1.25 nanoseconds. Thus, the present invention provides a counter capable of accuracy measurements depending on the frequency of the clock signal CLKφ. The precision of the counter approaches about $10^{-9}$ seconds with a clock signal CLKφ having a frequency around 800 MHz.

Referring now to FIG. 4, there is shown a schematic diagram of the first stage carry circuit 32 comprising an AND gate 50, an inverter gate 52, a NAND gate 54, a D-type flip-flop 56 and an inverter gate 58. The circuit 32 uses a lookahead scheme to generate the carry signal input to the second stage 34. Bits $B_{12}$ through $B_2$ are input to the AND gate 50. Bit $B_1$ is the significant signal. Bit $B_1$ is inverted by the inverter gate 52 and input to the NAND gate 54. As will be appreciated by one skilled in the art, the lookahead carry generation circuit of the first stage carry circuit 32 (as well as the carry circuit for the second stage 36 and the third stage 40, discussed below) can be implemented by using many different logic schemes and/or structures suitable for performing the desired function consistent with the present invention.

When bits $B_{12}$ through $B_2$ are all high, the output of the NAND gate 54 will go low when bit $B_1$ goes high. This produces a logic low carry one clock cycle before it is required. The output of the NAND gate 54 is then input to the D-type flip-flop 56 and clocked in with the clock signal CLK1 whereby the output of the D-type flip-flop 56 produces an active low carry signal CARRY OUT1 from the first stage 32. The signal CARRY OUT1 is inverted by the inverter gate 58 to produce the carry input signal CARRY IN2 which is input to the second stage 34. The propagation delay is generated by the clock to the D-type flip-flop 56 since the propagation delay of the combinational logic of the first stage carry circuit 32 is reduced to the delay of one inverter gate by the D-type flip-flop 56. As will be appreciated, the D-type flip-flop 56 can be designed specifically to reduce this propagation delay to aid in increasing the accuracy of the counting system 10.

Referring now to FIG. 5, there is shown a schematic diagram of the second stage carry circuit 36 comprising an AND gate 60, an inverter gate 62 and a NOR gate 64. While the circuit 36 uses a lookahead scheme to generate the carry signal input to the third stage 38, this scheme is different from the scheme utilized in the first stage carry circuit 32 and additionally depends on the carry out signal of the circuit 32. Bits $B_{24}$ through $B_{13}$ are input to the AND gate 60. When bits $B_{24}$ through $B_{13}$ are all high, the output of the AND gate 60 goes high. Now, when the signal CARRY OUT1 from the D-type flip-flop 56 of the circuit 32 goes low, a logic high carry is generated by the NOR gate 64 and input to the third stage 38. The inputs to the NOR gate 64 are the signal CARRY OUT1 generated from the first stage carry circuit 32 and the inversion (inverter gate 62) of the output of the AND gate 60. The output of the NOR gate 64 is an active high carry signal CARRY OUT2 which is input as the carry in signal to the third stage 38.

Referring now to FIG. 6A, there is shown a schematic diagram of the third stage carry circuit 40 comprising AND gates 70, 72 and 74. While the circuit 40 uses a lookahead scheme to generate the carry signal input to the fourth stage 42, this scheme is different from the scheme utilized in either the first stage carry circuit 32 or the second stage carry circuit 36. Bits $B_{36}$ through $B_{33}$ are input to the AND gate 70, while bits $B_{31}$ and $B_{30}$ are input to the AND gate 72. Bit $B_{32}$, bits $B_{29}$ through $B_{25}$, the outputs of the AND gates 70 and 72 and the signal CARRY OUT2 generated from the third stage carry circuit 36 are all input to the AND gate 74. When bits $B_{36}$ through $B_{25}$ are all high and the signal CARRY OUT2 transitions high, the output of the AND gate 72 goes high. The output of the AND gate 72 produces an active high carry signal CARRY OUT3 which is input as the carry in signal to the fourth stage 42. In this preferred embodiment, the AND gate 74 is a nine, two-input OR-AND complex gate functioning as an AND gate. This particular gate is faster than a single twelve-input AND gate.

An alternative embodiment of the circuit 40 is shown as third stage carry circuit 40a in FIG. 6B where bits $B_{36}$ through $B_{25}$ and the signal CARRY OUT2 generated from the third stage carry circuit 36 are all input to the AND gate 76.

As illustrated and described with reference to FIG. 3, the second counter 14 comprises three small counters having twelve bits each and one smaller counter having nine bits. The second counter 14 also includes carry generating circuits between each of the counters (stages) for generating carry signals to each stage of the second counter. These carry generating circuits reduce propagation delays associated with the carry signals. The second counter 14 utilizes the clock signal CLK1 having a frequency of one-half the frequency of the clock signal CLK$\phi$. The clock signal CLK$\phi$ is utilized as the clock for the plurality of first counters 12 (the LSB of counting system 10). This clocking scheme for the counting system 10 reduces the impact of any propagation delays in the second counter 14 and results in a counter capable of operation at the clock signal CLK$\phi$ frequency and having an accuracy related to the frequency of the clock signal CLK$\phi$.

Figure 7:
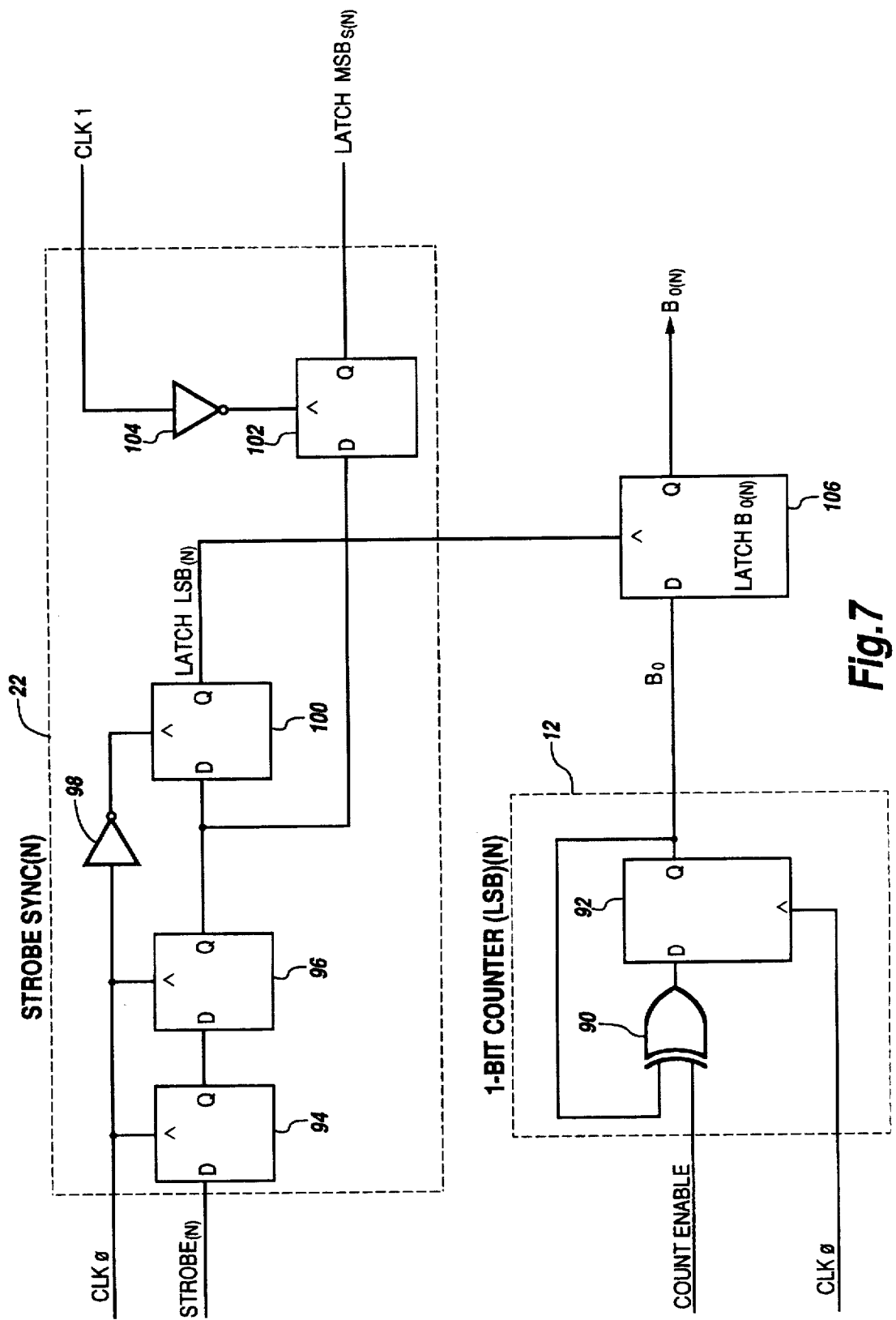
FIG. 7 illustrates the one bit counter, synchronization circuit and latching circuit for each of the timing channels N of FIG. 1.

Referring now to FIG. 7, there is shown a schematic diagram of the first counter 12 and the timing signal synchronization module 22 for one timing channel of the counting system 10. The counting system 10 preferably comprises six timing channels. The clocking scheme of the counting system 10 enables the least significant bit ($B_0$) of the counting system 10 to toggle at the clock signal CLK$\phi$ (when the first counter 12 contains only one bit). Hence, the least significant bit $B_0$ toggles at 800 MHz while the other forty-five bits of the second counter 14, bits $B_{45}$ through $B_1$, operate at 400 MHz. This architecture limits the number of flip-flops (bit registers) that operate from the clock signal CLK$\phi$. Since the clock signal CLK$\phi$ is operating at a very high frequency it is desired to reduce the circuit distribution length of the signal CLK$\phi$. The present invention reduces this distribution length by use of the first counter 12 (bit $B_0$) and the second counter 14 (bits $B_{45}$ through $B_1$). The present invention provides six identical one-bit first counters 12, one for each channel, to minimize timing problems. The bit $B_0$ time delay is reduced by placing the latch register for bit $B_0$ in close proximity to the corresponding one-bit first counter 12. This also reduces loading since each one-bit first counter 12 only drives one latch register, instead of having only one one-bit counter 12 driving six latch registers.

While the preferred embodiment provides for six timing channels, the counter of the present invention may be used beneficially for a simple counting system having one timing channel, or in a counting system producing bit signals for later processing.

As shown in FIG. 7, the first counter 12 comprises an EXOR gate 90 and a D-type flip-flop 92. The signal COUNT ENABLE is input to the EXOR gate 90 while the signal CLK$\phi$ is input to the clocking input of the D-type flip-flop 92. The output of the D-type flip-flop 92 is fed back to the EXOR gate 90. The output of the D-type flip-flop 92 is the least significant bit "$B_0$" of the counting system 10.

In the preferred embodiment, six timing channels are provided. As such, the reference (LSB)(n) illustrated in FIG. 7 represents the plurality of timing channels. The timing signals STROBE(N) are asynchronous signals generated externally to the counting system. In order to properly latch the counter value without error, these signals are synchronized to the clock signal CLK$\phi$ before latching the counter value into the appropriate latch/shift register 16. The timing signal synchronization circuitry 22 comprises D-type flip-flops 94, 96, 100, 102 and inverter gates 98 and 104. The signal STROBE(N) is input to the D-type flip-flop 94 whose output is then input to the D-type flip-flop 96. The signal STROBE is synchronized by the clock signal CLK$\phi$, as shown. The output of the D-type flip-flop 96 is then input to the D-type flip-flops 100 and 102. The input to the D-type flip-flop 100 is then reclocked with the inverse of the clock signal CLK$\phi$ output from the inverter gate 98 to generate a signal LATCH LSB(N). The signal LATCH LSB(N) latches the least significant bit $B_0$ into the latch register 106, which is part of the latch/shift register 16 (see FIG. 1). The input to the D-type flip-flop 102 is reclocked with the inverse of the clock signal CLK1 output from the inverter gate 104 to generate a signal LATCH MSBs(N) which latches the remaining forty-five bits (bits $B_{45}$ through $B_1$) into the latch/shift register 16.

Once the counter value is latched into the appropriate latch register, the value is transferred to a shift register (not shown) included in the latch/shift register 16 (as shown in FIG. 1). Then, the counter value can be serially (or parallel) shifted out as signal LBPTOD(N) (shown in FIG. 1) to locations where it is desired.

The present invention also provides for a programmable rollover reset of the counter. In the preferred embodiment, the counting system 10 counts the number of 1.25 nanosecond "ticks" in a twenty-four hour day. At midnight, the counter rolls over to all zeros.

With reference to FIG. 1, the rollover/reset generator 18 monitors the count and when the counter reaches the desired value it resets the counter at midnight to all zeros. For flexibility, the rollover/reset generator 18 is programmed to rollover the counter to all zeros when the programmed value is reached by the counter. Therefore, it is possible to program the counter to rollover at values such as one hour, twelve hours, fifteen minutes, etc.

The rollover/reset generator 18 comprises a set of rollover value latches (not shown) each containing the desired rollover value. This value is loaded into the rollover/reset generator 18 through a sixteen bit INITIALIZE DATA BUS. During operation, the rollover/reset generator 18 monitors the value of the counter. The value (bits) of the counter are compared with the value programmed in the rollover value latches using comparators (not shown). When the counter value equals the value in the rollover value latches, the counter is reset to all zeros. The rollover/reset generator 18 further comprises a lookahead scheme circuit (not shown) which allows resetting of the counter to all zeros with little or no propagation delay. A lookahead scheme is utilized since a significant propagation delay in the rollover of the counter would detract from the overall accuracy of the counting system.

Although several embodiments of the present invention have been described in the foregoing detailed description and illustrated in the accompanying drawings, it will be understood by those skilled in the art that the invention is not limited to the embodiments disclosed, but is capable of numerous rearrangements, substitutions and modifications without departing from the spirit of the invention.

We claim:

1. A counting system comprising:
   a counter including a first stage having at least one register defining a bit position and a plurality of successive stages each having at least one register defining a bit position, said first stage responding to a first clock signal having periodic clock pulses of a first predetermined frequency and said successive stages responding to a second clock signal having periodic clock pulses of a second predetermined frequency, the second predetermined frequency having a different frequency value than the first predetermined frequency;
   a circuit for generating lookahead carry signals applied to at least one of the successive stages of the counter; and
   a clock input for supplying the first and second clock signals to the counter.

2. A counting system in accordance with claim 1 wherein the frequency of the second clock signal is one-half the frequency of the first clock signal.

3. A counting system in accordance with claim 2 wherein the clock input includes means for inverting the first clock signal and dividing the first clock signal by two to generate the second clock signal.

4. A counting system in accordance with claim 1 wherein the frequency of the second clock signal is $1/(2^b)$ of the frequency of the first clock signal where "b" equals the number of registers in the first stage.

5. A counting system in accordance with claim 1 including a clock signal generator for generating the second clock signal 180 degrees out of phase with a most significant register of the first stage.

6. A counting system in accordance with claim 1 wherein the first stage comprises one register and the plurality of successive stages further comprises:
   a first successive stage having a plurality of registers each defining a bit position; and
   a second successive stage having a plurality of registers each defining a bit position.

7. A counting system in accordance with claim 6 wherein the first successive stage includes "n" registers defining bit positions $B_n$ through $B_1$, and the circuit for generating lookahead carry signals comprises:
   a first AND gate, the inputs to said first AND gate include the bits $B_n$ through $B_2$;
   a first NAND gate, the inputs to said first NAND gate include the output of the first AND gate and the inverse of bit $B_1$;
   a first carry flip-flop, the inputs to said first carry flip-flop include the second clock signal and the output from the first NAND gate;
   an inverter for inverting the output of said first carry flipflop; and
   a first connector for coupling the inverted output of said first carry flip-flop to the input of the second successive stage as a first carry signal.

8. A counting system in accordance with claim 7 wherein the second successive stage includes "k" registers defining bit positions $B_{k+n}$ through $B_{n+1}$, where "n" is the number of registers in the first successive stage, said plurality of successive stages further comprising a third successive stage having a plurality of registers each defining a bit position, and the circuit for generating lookahead carry signals further comprises:
   a second AND gate, the inputs to said second AND gate include bits $B_{k+n}$ through $B_{n+1}$;
   an inverter for inverting the output of the second AND gate;
   a first NOR gate, the inputs to said first NOR gate include the inverted output of the second AND gate and the output of the first carry flip-flop; and
   a second connector for coupling the output of said first NOR gate to the input of the third successive stage as a second carry signal.

9. A counting system in accordance with claim 8 wherein the third successive stage includes "p" registers defining bits $B_{p+k+n}$ through $B_{k+n+1}$, where "n" and "k" are the number of registers in the first successive stage and second successive stage, respectively, said plurality of successive stages further comprising a fourth successive stage having a plurality of registers each defining a bit position, and the circuit for generating lookahead carry signals further comprises:
   a third AND gate, the inputs to said third AND gate include bits $B_{p+k+n}$ through $B_{k+n+1}$ and the output of the first NOR gate; and
   a third connector for coupling the output of said third AND gate to the input of the fourth successive stage as a third carry signal.

10. A counting system in accordance with claim 9 wherein the number of registers "n" equals twelve, the number of registers "k" equals twelve, the number of registers "p" equals twelve, the number of registers in the fourth successive stage equals nine, and the frequency of the first clock signal is at least about 400 megahertz.

11. A counting system in accordance with claim 9 wherein the counter is programmable to a predetermined rollover count.

12. A counting system in accordance with claim 6 wherein the two least significant bit registers of each of the first and second successive stages are duplicated to reduce the loading on the outputs of the two least significant bit registers.

13. A counting system in accordance with claim 6 wherein the counter is programmable to a predetermined rollover count.

14. A counting system comprising:

a first register defining a least significant bit, said first register responding to a first clock signal having periodic clock pulses of a first predetermined frequency;

a plurality of successive counting stages each having at least one register, each of said registers defining a bit position, said plurality of successive stages responding to a second clock signal having periodic clock pulses of a second predetermined frequency, the second predetermined frequency having a different frequency value than the first predetermined frequency; and a circuit for generating lookahead carry signals applied to each of the plurality of successive stages.

15. A counting system in accordance with claim 14 wherein the frequency of the second clock signal is one-half the frequency of the first clock signal.

16. A counting system in accordance with claim 14 including a clock signal generator for generating the second clock signal substantially 180 degrees out of phase with the least significant bit of the first counter.

17. A counting system in accordance with claim 14 further comprising:

a timing channel comprising the first register, a first latch register, and a second latch register, said timing channel receiving a timing signal for latching the value of the first register into the first latch register and the values of the registers in the plurality of successive stages into the second latch register.

18. The counting system in accordance with claim 17 further comprising a plurality of timing channels, each timing channel comprising a first register, a first latch register and a second latch register and each of said timing channels receiving a respective timing signal for latching the value of the respective first register into the respective first latch register and the values of the registers in the plurality of successive stages into the respective second latch register.

19. The counting system in accordance with claim 14 wherein the plurality of successive counting stages comprises:

a first successive stage comprising a plurality of registers "n" defining bits $B_n$ through B;

a second successive stage comprising a plurality of registers "k" defining bits $B_{k+n}$ through $B_{+1}$;

a third successive stage comprising a plurality of registers "p" defining bits $B_{p+k+n}$ through $B_{k+n+1}$;

where "n", "k" and "p" equal the number of registers in the first successive stage, the second successive stage and the third successive stage, respectfully.

20. The counting system in accordance with claim 19 wherein the circuit for generating lookahead carry signals comprises:

a first AND gate, the inputs to said first AND gate include the bits $B_n$ through $B_2$;

a first NAND gate, the inputs to said first NAND gate include the output of the first AND gate and the inverse of bit $B_1$; and a first carry flip-flop, the inputs to said first carry flip-flop include the second clock signal and the output from the first NAND gate whereby the output of said first carry flip-flop is inverted and coupled to the second successive stage and input as a first carry signal.

21. The counting system in accordance with claim 20 wherein the circuit for generating lookahead carry signals further comprises:

a second AND gate, the inputs to said second AND gate include bits $B_{k+n}$ through $B_{n+1}$;

an inverter for inverting the output of the second AND gate; and a first NOR gate, the inputs to said NOR gate include the inverted output of the second AND gate and the output of the first carry flip-flop whereby the output of said first NOR gate is coupled to the third successive stage input as a second carry signal.

22. The counting system in accordance with claim 21 wherein the circuit for generating lookahead carry signals further comprises:

a third AND gate, the inputs to said third AND gate include bits $B_{p+k+n}$ through $B_{k+n+1}$ and the output of the first NOR gate whereby the output of said third AND gate is coupled and input as a third carry signal to a fourth successive stage comprising a plurality of registers "r" defining bits $B_{r+p+k+n}$ through $B_{p+k+n+}$.

23. The counting system in accordance with claim 22 wherein the number of registers "n", "k" and "p" equals twelve and the number of registers "r" equals nine.

24. A precision time of day counting system comprising:

a first stage comprising at least one register defining a bit, said first stage responding to a first clock signal having periodic pulses;

a second stage comprising a plurality of subordinate counters interconnected to receive a plurality of carry signals, each of said subordinate counters having at least one register defining a bit, said second stage responding to a second clock signal having periodic clock pulses;

at least one circuit for generating and supplying the carry signals to the subordinate counters;

a first latch register for latching the least significant bit of the first stage in response to a timing signal;

a second latch register for latching the bits of the second stage in response to the timing signal; and a shift register for serially outputting the bits in the first and second latch register.

25. A precision time of day counting system in accordance with claim 24 wherein the second clock signal is 180 degrees out of phase with the most significant bit of the first counter.

26. A precision time of day counting system in accordance with claim 25 wherein the at least one circuit for generating and supplying the carry signals comprises a plurality of gates interconnected to reduce the propagation delay through the second counter to less than about (2/f) where f is the frequency of the first clock signal.

27. A precision time of day counting system in accordance with claim 26 wherein the second stage comprises:

a first subordinate counter comprising "n" registers defining bits $B_n$ through $B_1$;

a second subordinate counter comprising "k" registers, defining bits $B_{k+n}$ through $B_{n+1}$;

a third subordinate counter comprising "p" registers, defining bits $B_{p+k+n}$ through $B_{k+n+1}$;

a fourth subordinate counter comprising "r" register, defining bits $B_{r+p+k+n}$ through $B_{p+k+n+1}$; and the first stage comprising a register defining bit $B_0$.

28. A precision time of day counting system in accordance with claim 27 wherein the two least significant bit registers of each the first, second and third subordinate counters are duplicated to reduce loading on the outputs of the two least significant bit registers.

29. A precision time of day counting system in accordance with claim 24 further comprising a plurality of first stages, first latch registers, second latch registers and shift registers.

30. A precision time of day counting system in accordance with claim 29 wherein the second clock signal is substantially 180 degrees out of phase with a most significant bit of the first stage.

31. A counting system comprising:
- a plurality of stages each having at least one register defining a bit position, said stages responding to a clock signal having periodic pulses of a predetermined frequency;
- a circuit for generating lookahead carry signals applied to at least one of the plurality of stages;
- a latch register for latching the bits of each of the stages in response to the timing signals; and
- a shift register for serially outputting the bits of the latch register.

32. A counting system in accordance with claim 31 wherein the plurality of stages comprises:
- a first stage having "n" registers defining bit positions $B_n$ through $B_1$;
- a second stage having "k" registers defining bit positions $B_{k+n}$ through $B_{n+1}$;
and wherein the circuit for generating lookahead signals comprises:
- a first AND gate, the inputs to said first AND gate include the bits $B_n$ through $B_2$;
- an inverter for inverting the output of the second AND gate;
- a first NAND gate, the inputs to said first NAND gate include the output of the first AND gate and the inverse of bit $B_1$;
- a first carry flip-flop, the inputs to said first carry flip-flop include the clock signal and the output from the first NAND gate;
- an inverter for inverting the output of said first carry flip-flop; and
- a first connector for coupling the inverted output of said first carry flip-flop to the input of the second stage as a first carry signal.

33. A counting system in accordance with claim 32 wherein the plurality of stages further comprises a third stage having "p" registers defining bits $B_{p+k+n}$ through $B_{k+n+1}$ and wherein the circuit for generating lookahead carry signals further comprises:
- a second AND gate, the inputs to said second AND gate include bits $B_{k+n}$ through $B_{n+1}$; and
- an inverter for inverting the output of the second AND gate;
- a first NOR gate, the inputs to said first NOR gate include the inverted output of the second AND gate and the output of the first carry flip-flop; and
- a second connector for coupling the output of said first NOR gate to the input of the third stage as a second carry signal.

34. A counting system in accordance with claim 33 wherein the plurality of stages further comprises a fourth stage and wherein the circuit for generating lookahead carry signals further comprises:
- a third AND gate, the inputs to said third AND gate include bits $B_{p+k+n}$ through $B_{k+n+1}$ and the output of the first NOR gate; and
- a third connector for coupling the output of said third AND gate to the input of the fourth stage as a third carry signal.

* * * * *

UNITED STATES PATENT AND TRADEMARK OFFICE
CERTIFICATE OF CORRECTION

PATENT NO. : 5,706,322

DATED : January 6, 1998

INVENTOR(S) : Albert D. Scalo, et al.

It is certified that error appears in the above-identified patent and that said Letters Patent is hereby corrected as shown below:

On the title page, item:

[56] References Cited, column 2, line 1, delete "4,447,918 5/1984" insert --4,477,918 10/1984--.

Column 8 line 22, delete "flipflop" and insert --flip-flop--.

Column 9, line 19, delete "catty" and insert --carry--.

Column 9, line 51, delete "$B_{+1}$", and insert --$B_{n+1}$--.

Column 10, line 24, delete "$B_{p+k+n+}$" and insert --$B_{p+k+n+1}$--.

Signed and Sealed this

Third Day of November, 1998

Attest:

Attesting Officer

BRUCE LEHMAN

Commissioner of Patents and Trademarks